(12) United States Patent
Kim et al.

(10) Patent No.: US 9,099,589 B2
(45) Date of Patent: *Aug. 4, 2015

(54) MULTI-LAYERED FILM AND PHOTOVOLTAIC MODULE INCLUDING THE SAME

(71) Applicant: LG CHEM, LTD., Seoul (KR)

(72) Inventors: Hyun Cheol Kim, Daejeon (KR); Yoon Kyung Kwon, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/928,197

(22) Filed: Jun. 26, 2013

(65) Prior Publication Data

US 2013/0284245 A1   Oct. 31, 2013

Related U.S. Application Data

(63) Continuation of application No. PCT/KR2011/009336, filed on Dec. 2, 2011.

(30) Foreign Application Priority Data

Dec. 29, 2010  (KR) .................. 10-2010-0138242
Dec. 2, 2011   (KR) .................. 10-2011-0128415

(51) Int. Cl.
  *B32B 18/00*  (2006.01)
  *B32B 27/06*  (2006.01)
  (Continued)

(52) U.S. Cl.
  CPC .......... *H01L 31/0487* (2013.01); *C08F 14/18* (2013.01); *C08F 14/22* (2013.01); *C08F 34/02* (2013.01); *C08J 5/18* (2013.01);
  (Continued)

(58) Field of Classification Search
  None
  See application file for complete search history.

(56) References Cited

U.S. PATENT DOCUMENTS 4,296,151 A * 10/1981 Boultinghouse .............. 427/322
4,929,666 A *  5/1990 Schmidt et al. ............... 524/516
(Continued)

FOREIGN PATENT DOCUMENTS

JP   2011-007368       1/2001
JP   2001-072819    *  3/2001
(Continued)

OTHER PUBLICATIONS

EPOCROS (Oxazoline-Functional Polymer) (http://www.shokubai.co.jp/en/products/functionality/epocros.html) (wepage retrieved Jun. 15, 2014).*

*Primary Examiner* — Vivian Chen
(74) *Attorney, Agent, or Firm* — McKenna Long & Aldridge LLP

(57) ABSTRACT

A multi-layered film, a backsheet for photovoltaic modules, a method of manufacturing the same, and a photovoltaic module are provided. The multi-layered film can be configured so that a resin layer including a fluorine-based polymer and an oxazoline group-containing polymer is formed on a substrate. As a result, the resin layer including the fluorine-based polymer can have excellent durability and weather resistance, and show high interfacial adhesive strength to the substrate. During the preparation of the multi-layered film, a drying process can also be performed at a relatively low temperature, so that the manufacturing costs can be reduced and the quality of the product can be prevented from being deteriorated by thermal deformation or thermal shock. The multi-layered film may be effectively used as the backsheet in a variety of photovoltaic modules.

31 Claims, 1 Drawing Sheet

(51) Int. Cl.

| | |
|---|---|
| B32B 27/18 | (2006.01) |
| B32B 27/30 | (2006.01) |
| B32B 27/32 | (2006.01) |
| B32B 27/36 | (2006.01) |
| B32B 27/40 | (2006.01) |
| B05D 3/02 | (2006.01) |
| B05D 3/04 | (2006.01) |
| B05D 3/08 | (2006.01) |
| B05D 3/10 | (2006.01) |
| B05D 3/14 | (2006.01) |
| C08L 27/04 | (2006.01) |
| C08L 27/14 | (2006.01) |
| C08L 27/16 | (2006.01) |
| C08L 27/18 | (2006.01) |
| C08L 27/20 | (2006.01) |
| C08L 33/06 | (2006.01) |
| C08L 33/08 | (2006.01) |
| C08L 33/10 | (2006.01) |
| C08L 33/12 | (2006.01) |
| C08L 39/04 | (2006.01) |
| C09D 127/04 | (2006.01) |
| C09D 127/12 | (2006.01) |
| C09D 127/14 | (2006.01) |
| C09D 127/16 | (2006.01) |
| C09D 127/18 | (2006.01) |
| C09D 127/20 | (2006.01) |
| C09D 133/00 | (2006.01) |
| C09D 133/06 | (2006.01) |
| C09D 133/08 | (2006.01) |
| C09D 133/10 | (2006.01) |
| C09D 133/12 | (2006.01) |
| C09D 139/00 | (2006.01) |
| H01L 31/048 | (2014.01) |
| C08F 14/18 | (2006.01) |
| C08F 34/02 | (2006.01) |
| C08J 5/18 | (2006.01) |
| C08J 7/04 | (2006.01) |
| C08L 23/04 | (2006.01) |
| C08F 14/22 | (2006.01) |
| H01L 31/049 | (2014.01) |
| H01L 31/18 | (2006.01) |
| B32B 27/34 | (2006.01) |
| B05D 3/00 | (2006.01) |
| C08K 5/00 | (2006.01) |
| C08K 3/00 | (2006.01) |

(52) U.S. Cl.
CPC . *C08J 7/04* (2013.01); *C08L 23/04* (2013.01); *H01L 31/049* (2014.12); *H01L 31/18* (2013.01); *H01L 31/186* (2013.01); *B05D 3/002* (2013.01); *B05D 3/02* (2013.01); *B05D 3/04* (2013.01); *B05D 3/08* (2013.01); *B05D 3/101* (2013.01); *B05D 3/144* (2013.01); *B32B 18/00* (2013.01); *B32B 27/06* (2013.01); *B32B 27/18* (2013.01); *B32B 27/304* (2013.01); *B32B 27/308* (2013.01); *B32B 27/322* (2013.01); *B32B 27/34* (2013.01); *B32B 27/36* (2013.01); *B32B 27/40* (2013.01); *B32B 2255/10* (2013.01); *B32B 2255/26* (2013.01); *B32B 2255/28* (2013.01); *B32B 2327/12* (2013.01); *B32B 2327/18* (2013.01); *B32B 2333/04* (2013.01); *B32B 2333/08* (2013.01); *B32B 2333/12* (2013.01); *B32B 2367/00* (2013.01); *B32B 2377/00* (2013.01); *B32B 2457/12* (2013.01); *C08K 3/0008* (2013.01); *C08K 3/0033* (2013.01); *C08K 3/0041* (2013.01); *C08K 5/005* (2013.01); *C08K 5/0008* (2013.01); *C08L 27/04* (2013.01); *C08L 27/14* (2013.01); *C08L 27/16* (2013.01); *C08L 27/18* (2013.01); *C08L 27/20* (2013.01); *C08L 33/06* (2013.01); *C08L 33/062* (2013.01); *C08L 33/08* (2013.01); *C08L 33/10* (2013.01); *C08L 33/12* (2013.01); *C08L 39/04* (2013.01); *C09D 127/04* (2013.01); *C09D 127/12* (2013.01); *C09D 127/14* (2013.01); *C09D 127/16* (2013.01); *C09D 127/18* (2013.01); *C09D 127/20* (2013.01); *C09D 133/00* (2013.01); *C09D 133/06* (2013.01); *C09D 133/062* (2013.01); *C09D 133/08* (2013.01); *C09D 133/10* (2013.01); *C09D 133/12* (2013.01); *C09D 139/00* (2013.01); *Y02E 10/50* (2013.01); *Y10T 428/264* (2015.01); *Y10T 428/266* (2015.01); *Y10T 428/3154* (2015.04); *Y10T 428/3158* (2015.04); *Y10T 428/3175* (2015.04); *Y10T 428/31544* (2015.04); *Y10T 428/31797* (2015.04); *Y10T 428/31935* (2015.04)

(56) References Cited

U.S. PATENT DOCUMENTS

| | | | | | |
|---|---|---|---|---|---|
| 5,006,624 | A | * | 4/1991 | Schmidt et al. | 526/243 |
| 5,171,804 | A | * | 12/1992 | Tomihashi et al. | 526/247 |
| 5,389,159 | A | * | 2/1995 | Kataoka et al. | 136/251 |
| 5,578,141 | A | * | 11/1996 | Mori et al. | 136/251 |
| 5,608,003 | A | * | 3/1997 | Zhu | 524/516 |
| 5,705,573 | A | * | 1/1998 | Swanson et al. | 525/343 |
| 5,731,095 | A | * | 3/1998 | Milco et al. | 428/482 |
| 5,760,126 | A | * | 6/1998 | Engle et al. | 524/516 |
| 5,863,875 | A | * | 1/1999 | Steckel | 508/551 |
| 5,958,524 | A | * | 9/1999 | Dehennau et al. | 427/533 |
| 5,990,226 | A | * | 11/1999 | Arita et al. | 524/516 |
| 5,998,521 | A | * | 12/1999 | Fan et al. | 524/225 |
| 6,005,043 | A | * | 12/1999 | Zhu | 524/493 |
| 6,090,897 | A | * | 7/2000 | Akasaki et al. | 428/520 |
| 6,201,056 | B1 | * | 3/2001 | Zhu | 524/493 |
| 6,680,093 | B1 | * | 1/2004 | Ries et al. | 428/36.6 |
| 6,759,480 | B1 | * | 7/2004 | Bouilloux et al. | 525/60 |
| 7,553,540 | B2 | * | 6/2009 | Debergalis et al. | 428/335 |
| 8,124,221 | B2 | * | 2/2012 | Uschold et al. | 428/215 |
| 8,268,254 | B2 | * | 9/2012 | Van Bonn et al. | 422/129 |
| 8,507,029 | B2 | * | 8/2013 | Temchenko et al. | 427/74 |
| 8,518,523 | B2 | * | 8/2013 | Hashimoto et al. | 428/215 |
| 2006/0074179 | A1 | * | 4/2006 | Coca et al. | 524/544 |
| 2010/0000603 | A1 | * | 1/2010 | Tsuzuki et al. | 136/259 |
| 2010/0063206 | A1 | * | 3/2010 | Van Bonn et al. | 525/50 |
| 2010/0215902 | A1 | * | 8/2010 | Kiehne et al. | 428/141 |
| 2011/0108094 | A1 | * | 5/2011 | Nishijima et al. | 136/251 |
| 2013/0247984 | A1 | * | 9/2013 | Kim et al. | 136/259 |
| 2013/0309505 | A1 | * | 11/2013 | Kim et al. | 428/422 |
| 2014/0034109 | A1 | * | 2/2014 | Kim et al. | 136/244 |

FOREIGN PATENT DOCUMENTS

| | | |
|---|---|---|
| JP | 2001-111073 | 4/2001 |
| JP | 2004-107573 A | 4/2004 |
| JP | 2005-196122 A | 7/2005 |
| JP | 2006-231317 | 9/2006 |
| JP | 2008-108947 | 5/2008 |
| JP | 2008-214594 | 9/2008 |
| JP | 2009-267294 | 11/2009 |
| JP | 2010-084067 | 4/2010 |
| JP | 2010-221614 A | 10/2010 |
| JP | 2010-287662 | 12/2010 |
| JP | 2011-071447 | 4/2011 |
| KR | 1020110048474 | 5/2011 |

* cited by examiner

_US 9,099,589 B2_

MULTI-LAYERED FILM AND PHOTOVOLTAIC MODULE INCLUDING THE SAME

This application is a Continuation Bypass of International Application No. PCT/KR2011/009336, filed Dec. 2, 2011, and claims priority to and the benefit of Korean Patent Application Nos. 10-2010-0138242, filed Dec. 29, 2010, and 10-2011-0128415, filed Dec. 2, 2011, the disclosures of which are incorporated herein by reference in their entirety.

BACKGROUND

1. Technical Field

The disclosure relates to a multi-layered film, a backsheet for photovoltaic modules, a method of manufacturing the same, and a photovoltaic module comprising the multi-layered film.

2. Related Art

Recently, much attention has been paid to renewable and clean energy because of global environmental problems and exhaustion of fossil fuels. Among these, solar energy has attracted attention as a representative pollution-free energy source which can solve the problems of environmental contamination and exhaustion of fossil fuels.

A photovoltaic cell to which a principle of photovoltaic power generation is applied is a device configured to convert sunlight into electric energy. Since the photovoltaic cell is exposed to external environments for a long time to facilitate absorption of sunlight, it is manufactured into a unit by performing several packaging processes to protect the cells. The unit is referred to as a photovoltaic module.

Generally, a backsheet having excellent weather resistance and durability is used for the photovoltaic modules to stably protect the photovoltaic cell during long-term exposure to the external environments. Such a backsheet generally includes a backsheet in which a resin layer including a fluorine-based polymer such as polyvinyl fluoride (PVF) is stacked on a substrate.

However, the PVF resin has poor adhesion to a polyethylene terephthalate (PET) film typically used as a substrate for the backsheet. Thus, a fluorine-based polymer film obtained by extrusion or casting is laminated on a substrate using a urethane-based adhesive, and used as the substrate. However, this requires the use of expensive film preparing equipment, an adhesive and the application of additional adhesive coating and laminating processes. In addition, a film having a higher thickness than that is required to facilitate handling of the film should be used during the preparation of a film, the use of various additives and fillers are limited, and a high processing temperature is required.

On the other hand, even when a fluorine-based polymer film, which is prepared in the form of a resin suspension or solution, is coated and dried on a substrate, a solvent having a high boiling point is generally used, and thus a high drying temperature of 200° C. or more is required.

A large amount of energy is used to apply high-temperature heat to a PVF resin solution, which requires a high drying temperature. Accordingly, this increases the production costs of the backsheet for photovoltaic modules and also inflicts thermal shocks on a substrate or causes thermal deformation of the substrate, thereby degrading the quality (e.g., mechanical characteristics, etc.) of the product and rapidly deteriorating the mechanical properties over a long-term outdoor use.

Therefore, there is continuous demand for a material of the backsheet for photovoltaic cells, which has excellent durability and weather resistance and can be dried at a low drying temperature, so that the production costs can be reduced and the productivity and quality of the photovoltaic module can be improved.

SUMMARY

The embodiments of the disclosure are directed to provide a multi-layered film, a backsheet for photovoltaic modules, a method of manufacturing the same, and a photovoltaic module comprising the multi-layered film.

One aspect of the embodiments provides a multi-layered film including a substrate and a resin layer formed on the substrate and including a fluorine-based polymer and an oxazoline group-containing polymer.

Another aspect of the embodiments provides a method of manufacturing a multi-layered film that includes forming a resin layer including a fluorine-based polymer and an oxazoline group-containing polymer on a substrate.

Still another aspect of the embodiments provides a backsheet for photovoltaic modules including the multi-layered film according to one illustrative embodiment of the present application.

Yet another aspect of the embodiments provides a photovoltaic module including the backsheet for photovoltaic modules according to the present application.

BRIEF DESCRIPTION OF THE DRAWINGS

The above and other objects, features and advantages of the present application will become more apparent to those of ordinary skill in the art by describing in detail the illustrative embodiments thereof with reference to the attached drawings, in which.

DETAILED DESCRIPTION

Figure 1:
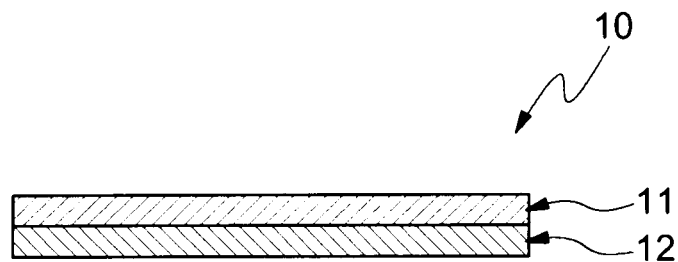
FIG. 1 is a cross-sectional view showing a multi-layered film according to one illustrative embodiment.

Hereinafter, the illustrative embodiments of the present application will be described in detail with reference to the accompanying drawings. In addition, detailed descriptions of related functions or constitutions that are widely known in the art will be omitted in the description. Also, the accompanying drawings are schematically shown in order to help in understanding the illustrative embodiments. Thus, parts that have no relations to clearly explain the illustrative embodiments will be omitted, and the drawings are enlarged in thickness to more clearly illustrate the various layers and regions. However, the thickness, size, ratio, and the like as shown in the drawings are intended not to limit the scope of the present application. The present application is not limited to the embodiments disclosed below, but can be implemented in various forms. The following embodiments are described in order to enable those of ordinary skill in the art to embody and practice the present application.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of the illustrative embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing the particular embodiments only and is not intended to limit the illustrative embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, illustrative embodiments of the present application will be described in detail below. To aid in understanding the present application, like numbers refer to like elements throughout the description of the figures, and the description of the same elements will not be reiterated.

One illustrative embodiment of the present application is directed to providing a multi-layered film including a substrate and a resin layer formed on the substrate. The resin layer includes a fluorine-based polymer and an oxazoline group-containing polymer.

FIG. 1 is a cross-sectional view showing a multi-layered film according to one illustrative embodiment. As shown in FIG. 1, the multi-layered film 10 includes a substrate 12 and a resin layer 11 formed on the substrate 12. Here, the resin layer 11 includes a fluorine-based polymer and an oxazoline group-containing polymer.

A specific types of the substrate 12 included in the multi-layered film 10 are not particularly limited, but may include various materials known in the art. Thus, these materials may be properly selected and used according to the desired functions and applications.

According to one illustrative embodiment, a variety of metal films or polymer films may be, for example, used as the substrate. As such, the metal film may include films formed of a metal component, for example, aluminum or iron, according to applications, and the polymer film may include a single sheet, stacked sheet or co-extruded product such as an acryl film, a polyolefin film, a polyamide film, a polyurethane film or a polyester film. Among these, a polyester film is generally used, but the present application is not particularly limited thereto. Examples of the polyester film include at least one selected from the group consisting of a PET film, a polyethylene naphthalate (PEN) film and a polybutylene terephthalate (PBT) film, but the present application is not particularly limited thereto.

Also, a polyester film having excellent hydrolysis resistance may be used as the polyester film. The polyester film having excellent hydrolysis resistance that may be used herein may include polyester films having a low content of oligomers generated during condensation polymerization. In addition, the polyester film may be given more excellent hydrolysis resistance by further subjecting the polyester film to known heat treatment for improving the hydrolysis resistance so that the content of moisture in the polyester can be lowered and the shrinkage rate can be reduced. A commercially available product may also be used as the polyester film having excellent hydrolysis resistance.

According to the illustrative embodiments, in order to enhance the adhesive strength to the resin layer as will be described later, one or both surfaces of the substrate may be subjected to surface treatment such as high-frequency spark discharge treatment such as corona or plasma treatment; thermal treatment; flame treatment; anchoring agent treatment; coupling agent treatment; primer treatment; or chemical activation using a gaseous Lewis acid (for example, $BF_3$), sulfuric acid or hot sodium hydroxide. Surface treatment may be performed using all the general methods known in the art.

According to the illustrative embodiments, the above-described surface treatment may introduce a carboxyl group, an aromatic thiol group and a phenolic hydroxyl group into the surface of the substrate to improve the binding property to an oxazoline group included in the resin layer, thereby further improving the binding affinity between the substrate and the resin layer.

In addition, an inorganic oxide deposition layer may also be formed on one or both surfaces of the substrate to improve the moisture barrier property. Kinds of the inorganic oxide are not particularly limited, but inorganic oxides having a moisture barrier property may be used without limitation. According to the illustrative embodiments, silicon oxide or aluminum oxide may be, for example, used as the inorganic oxide, but the present application is not particularly limited thereto. According to the illustrative embodiments, the method of forming an inorganic oxide deposition layer on one or both surfaces of the substrate is not particularly limited, but may be achieved using general deposition methods known in the art.

According to the illustrative embodiments, when the inorganic oxide deposition layer is formed on one or both surfaces of the substrate, an inorganic oxide deposition layer may be formed on the surface of the substrate and the inorganic oxide deposition layer may then be subjected to the above-described surface treatment.

The thickness of the substrate is not particularly limited, but may be, for example, in the range of 50 μm to 500 μm, or 100 μm to 300 μm. When the thickness of the substrate is controlled to this thickness range, the multi-layered film may show an excellent electric insulation property, moisture barrier property, mechanical property and handling property. However, the thickness of the substrate is not limited to this thickness range, but may be properly adjusted, as necessary.

The multi-layered film according to the illustrative embodiments includes a resin layer formed on the substrate and the resin layer includes a fluorine-based polymer and an oxazoline group-containing polymer. When the resin layer includes the oxazoline group-containing polymer in addition to the fluorine-based polymer, the adhesive strength between the substrate and the resin layer may be improved. That is, an oxazoline group-containing polymer having excellent compatibility with the fluorine-based polymer may be selected to facilitate formation of a blend with the fluorine-based polymer in the resin layer, and serve to enhance the adhesive strength to the substrate via the oxazoline group.

According to the illustrative embodiments, kinds of the fluorine-based polymer which is mixed with the oxazoline group-containing polymer to form a resin layer of the multi-layered film may be, for example, a homopolymer, a copolymer or a mixture thereof including at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluorobutyl ethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxol (PDD) and perfluoro-2-methylene-4-methyl-1,3-dioxolane (PMD) in a polymerized form.

Also, the fluorine-based polymer may be a copolymer including VDF and a comonomer or a copolymer including VF and a comonomer. Kinds of the comonomer which may be included in the copolymerized form in the fluorine-based copolymer are not particularly limited, but may include at least one selected from the group consisting of, for example, TFE, HFP, CTFE, trifluoroethylene, hexafluoroisobutylene, perfluorobutyl ethylene, PMVE, PEVE, PPVE, PHVE, PDD and PMD, but the present application is not particularly limited thereto. As one example, the comonomer may be one of HFP and CTFE.

According to the illustrative embodiments, a content of the comonomer included in the fluorine-based copolymer is not particularly limited, but may be, for example, in the range of 0.5% by weight to 50% by weight, 1% by weight to 40% by weight, 7% by weight to 40% by weight, 10% by weight to 30% by weight, or 10% by weight to 20% by weight, based on the total weight of the fluorine-based copolymer. According to the illustrative embodiments, when the content of the comonomer included in the fluorine-based copolymer is controlled to this content range, the durability and weather resistance of the multi-layered film may be secured and effective interdiffusion and low-temperature drying may be induced.

According to the illustrative embodiments of the present application, the fluorine-based polymer may have a weight average molecular weight of 50,000 to 1,000,000, 100,000 to 700,000, or 300,000 to 500,000, but the present application is not particularly limited thereto. The weight average molecular weight is a value converted from that of a polystyrene standard as measured using gel permeation chromatography (GPC). According to the illustrative embodiments, when the weight average molecular weight of the fluorine-based polymer is controlled to this range, excellent solubility and other physical properties may be secured.

According to some illustrative embodiments of the present application, the fluorine-based polymer includes i) a first fluorine-based polymer having a melting point of 155° C. or less or a softening point of 100° C. or less. Since such the first fluorine-based polymer especially has good miscibility with a polymer containing an oxazoline group, the first fluorine-based polymer may serve to improve the durability of the multi-layered film. Also, the fluorine-based polymer may further include ii) a second fluorine-based polymer having a melting point of 155° C. or more and a softening point of 100° C. or more in addition to the first fluorine-based polymer. However, the second fluorine-based polymer may be optionally used, as necessary.

Both the first and second fluorine-based polymers correspond to the above-described fluorine-based polymers, and may be classified according to the melting point and softening point, which are innate characteristics of the material in polymerization of the fluorine-based monomer. The first fluorine-based polymer having a melting point of 155° C. or less or a softening point of 100° C. or less may account for 20% by weight or more, or 50% by weight or more, in the fluorine-based polymer of the entire resin layer. A lower limit of the melting point of the first fluorine-based polymer is not particularly limited, but may be 80° C. or more. Also, an upper limit of the melting point of the second fluorine-based polymer is not particularly limited, but may be 175° C. or less. According to the present application, the melting point or softening point of the fluorine-based polymer may be controlled so that the miscibility with the oxazoline group-containing polymer can be enhanced, deformation caused by the use of the multi-layered film can be prevented, the solubility in a solvent can be adjusted, and the gloss of the coated surface can be improved. In the case of an aqueous dispersion composition, fluorine-based polymer particles having a low melting point may also be selected and melted at a low temperature so that a uniformly coated external appearance can be obtained and degradation of a substrate included in the multi-layered film can be prevented during the preparation of the multi-layered film.

According to the illustrative embodiments, kinds of the oxazoline group-containing polymer which is mixed with the fluorine-based polymer to form a multi-layered film are not particularly limited. However, oxazoline group-containing polymers may be used without limitation as long as they have excellent compatibility with the fluorine-based polymer. According to the illustrative embodiments, a single polymer of an oxazoline group-containing monomer; a copolymer including an oxazoline group-containing monomer and at least one comonomer; or a mixture thereof may be, for example, used as the oxazoline group-containing polymer, but the present application is not particularly limited thereto.

The oxazoline group-containing monomer that may be used herein may be a compound represented by the following Formula 1.

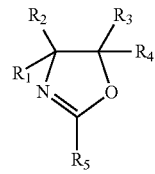

Formula 1

In Formula 1, $R_1$, $R_2$, $R_3$ and $R_4$ each independently represent a hydrogen atom, an alkyl group, a halogen, or a substituted or unsubstituted phenyl group, and $R_5$ represents an acyclic hydrocarbon group having an unsubstituted bond.

A substituent for the substituted or unsubstituted phenyl group may include at least one selected from the group consisting of an amino group, a methyl group, a chloromethyl group and a chloro group.

Also, the acyclic hydrocarbon group having the unsubstituted bond may include an alkenyl group, an alkynyl group or an olefin group which may be radically polymerizable with the acyclic hydrocarbon group, but the present application is not particularly limited thereto.

The alkenyl group may be, for example, an alkenyl group having 1 to 12 carbon atoms or 1 to 5 carbon atoms, the alkynyl group may be, for example, an alkynyl group having 1 to 12 carbon atoms or 1 to 5 carbon atoms, and the olefin group may be, for example, an olefin group having 1 to 12 carbon atoms or 1 to 5 carbon atoms, but the present application is not particularly limited thereto.

According to the illustrative embodiments, specific examples of the compound represented by Formula 1 may include at least one selected from the group consisting of 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline, but the present application is not particularly limited thereto.

In the copolymer including the oxazoline group-containing monomer and at least one comonomer according to the illustrative embodiments, the oxazoline group-containing monomer may be included in an amount of 1% by weight or more, 5% by weight to 95% by weight, or 10% by weight to 90% by weight, based on the total weight of the copolymer. When the oxazoline group-containing monomer is present in an amount of less than 1% by weight in the copolymer including the oxazoline group-containing monomer and at least one comonomer according to the present application, it is difficult to give a sufficient adhesive strength between the substrate and the primer layer.

In the illustrative embodiments of the present application, kinds of the comonomer included in the polymerized form in the copolymer including the oxazoline group-containing monomer and at least one comonomer are not particularly limited, but comonomers which do not react with the oxazoline group but are copolymerizable with the oxazoline group-containing monomer may be used without limitation. According to the illustrative embodiments, the comonomer may include at least one selected from the group consisting of, for example, an alkyl(meth)acrylate, an amide group-containing monomer, an unsaturated nitrile-based monomer, a vinyl ester-based monomer, a vinyl ether-based monomer, a halogen-containing α,β-unsaturated monomer and an α,β-unsaturated aromatic monomer, but the present application is not particularly limited thereto.

The alkyl(meth)acrylate may contain an alkyl group having 1 to 14 carbon atoms to balance the compatibility with the fluorine-based polymer and give an excellent pressure-sensitive adhesive property. For example, the alkyl(meth)acrylate may include at least one selected from the group consisting of methyl(meth)acrylate, ethyl(meth)acrylate, propyl(meth)acrylate, n-butyl(meth)acrylate, s-butyl(meth)acrylate, t-butyl(meth)acrylate, isobutyl(meth)acrylate, hexyl(meth)acrylate, 2-ethylhexyl(meth)acrylate, n-octyl(meth)acrylate, isooctyl(meth)acrylate, n-nonyl(meth)acrylate, isononyl(meth)acrylate, n-decyl(meth)acrylate, isodecyl(meth)acrylate, n-dodecyl(meth)acrylate, n-tridecyl(meth)acrylate and n-tetradecyl(meth)acrylate.

In the illustrative embodiments of the present application, examples of the amide group-containing monomer may also include (meth)acrylamide, diethylacrylamide, N-vinylpyrrolidone, N,N-dimethyl(meth)acrylamide, N,N-diethyl(meth)acrylamide, N,N'-methylenebisacrylamide, N,N-dimethylaminopropylacrylamide, N,N-dimethylaminopropyl methacrylamide, diacetone(meth)acrylamide or methylol(meth)acrylamide, examples of the unsaturated nitrile monomer may include (meth)acrylonitrile, ethacrylonitrile, phenylacrylonitrile or α-chloroacrylonitrile, examples of the vinyl ester monomer may include vinyl acetate or vinyl propionate, examples of the vinyl ether monomer may include methyl vinyl ether or ethyl vinyl ether, examples of the halogen-containing of monomer may include vinyl chloride, vinylidene chloride or unsaturated vinyl, and examples of the α,β-unsaturated aromatic monomer may include styrene or α-methylstyrene, but the present application is not particularly limited thereto.

According to the illustrative embodiments, the oxazoline group-containing polymer may have a weight average molecular weight of 5,000 to 500,000, 10,000 to 250,000, or 20,000 to 150,000, but the present application is not particularly limited thereto. According to the illustrative embodiments, when the weight average molecular weight of the oxazoline group-containing polymer is controlled to this range, the proper compatibility with the fluorine-based polymer and the fluidity may be secured to give the adhesive strength.

A method of polymerizing the oxazoline group-containing polymer that may be used herein is not particularly limited, but the oxazoline group-containing polymer may be polymerized using a known method such as solution polymerization, emulsion polymerization, bulk polymerization or suspension polymerization. Also, the resulting copolymer may be any one of a random copolymer, a block copolymer, an alternating copolymer and a graft copolymer. The variety of methods in preparing an oxazoline group-containing polymer are known in the art, and all these methods are applicable in the present application.

According to the illustrative embodiments, the resin layer may include the oxazoline group-containing polymer in an amount of 0.1 parts by weight to 50 parts by weight, 0.5 parts by weight to 25 parts by weight, or 1 part by weight to 10 parts by weight, based on 100 parts by weight of the fluorine-based polymer. According to the illustrative embodiments, the content of the oxazoline group-containing polymer may be controlled to this content range so that excellent adhesive reliability, light fastness and weather resistance can be secured. According to the illustrative embodiments, a thickness of the resin layer is not particularly limited, but may be, for example, in the range of 3 μm to 50 μm, or 10 μm to 30 μm. When the thickness of the resin layer is less than 3 μm, the resin layer is too thin to be filled with a sufficient amount of fillers, which leads to deterioration of the light shielding property. On the other hand, when the thickness of the resin layer exceeds 50 μm, the manufacturing costs may be increased.

The resin layer according to the illustrative embodiments may further include at least one of a pigment or filler in addition to the fluorine-based polymer and the oxazoline group-containing polymer in order to adjust the color or opacity of the resin layer or achieve the other objects. In this case, examples of the pigment or filler that may be used herein may include a metal oxide such as titanium dioxide ($TiO_2$), silica or alumina; a black pigment such as calcium carbonate, barium sulfate or carbon black; or a pigment component expressing other colors, but the present application is not particularly limited thereto. Such a pigment or filler may serve to improve the inherent effects of controlling the color or opacity of the resin layer and also further enhance the adhesive strength of the resin layer due to the presence of an inherent functional group included in each component.

The content of the other additive such as a pigment or filler may be 60% by weight or less, based on the solid content of the fluorine-based polymer and oxazoline group-containing polymer, but the present application is not particularly limited thereto.

Also, the resin layer according to the illustrative embodiments may further include at least one of the general components such as a UV stabilizer, a thermal stabilizer or barrier particles.

The resin layer including the fluorine-based polymer and the oxazoline group-containing polymer may be a coating layer. The term "coating layer" that may be used herein refers to a resin layer formed using a coating method. More particularly, the term "coating layer" means that a resin layer including the mixture of the above-described fluorine-based polymer and oxazoline group-containing polymer is formed by coating a substrate with a resin composition prepared by dissolving components constituting the resin layer in a solvent, for example, a solvent having a low boiling point, or a coating solution prepared by dispersing components constituting the resin layer in water, instead of a method of laminating a sheet prepared in a method such as casting or extrusion to a substrate using an adhesive.

FIG. 1 shows that a multi-layered film 10 according to one illustrative embodiment of the present application includes a substrate 12, and a resin layer 11 formed on only one surface of the substrate 12. However, a resin layer may be formed on the other surface of the substrate so that the multi-layered film (not shown) according to another illustrative embodiment of the present application can include the resin layer formed on both surfaces of the substrate.

Also, the multi-layered film according to the illustrative embodiment may further include various functional layers known in the art, as necessary. Examples of the functional layer may include an adhesive layer or an insulation layer. For the multi-layered film according to the illustrative embodiment, for example, the above-described resin layer may be formed on one surface of the substrate, and the adhesive layer and insulation layer may be sequentially formed on the other surface of the substrate. The adhesive layer or insulation layer may be formed using various methods known in the art. For example, the insulation layer may be a layer composed of ethylenevinylacetate (EVA) or low-density linear polyethylene (LDPE). The layer composed of EVA or LDPE may function as an insulation layer, and also function to enhance the adhesive strength to an encapsulant of the photovoltaic module, reduce the manufacturing costs and maintain excellent re-workability as well.

Also, another illustrative embodiment of the present application is directed to provide a method of manufacturing a multi-layered film including forming a resin layer that includes a fluorine-based polymer and an oxazoline group-containing polymer on a substrate.

According to the illustrative embodiment, the method of forming the resin layer on a substrate is not particularly limited. For example, a primer layer may be formed based on various methods known in the art by applying a resin composition or coating solution for forming a primer layer on a substrate and drying the resin composition or coating solution under predetermined conditions. Here, the resin composition or coating solution may be prepared by dissolving or dispersing the above-described fluorine-based polymer and oxazoline group-containing polymer in a suitable organic solvent or aqueous solvent. In this case, the coating method is not particularly limited, but any methods of forming a uniform coating layer, which include known printing methods such as offset printing and gravure printing or known coating methods such as roll coating, knife-edge coating or gravure coating, are applicable. According to the illustrative embodiment, various methods known in the art are applicable in addition to the above-described methods and the resin composition or coating solution may further include other various additives, as necessary.

Specific kinds of the substrate that may be used in the preparation method according to the illustrative embodiment are described above. Before formation of the resin layer, at least one suitable surface treatment selected from the group consisting of deposition, plasma treatment, corona treatment, anchoring agent treatment, coupling agent treatment, primer treatment and thermal treatment may be performed on one or both surfaces of the substrate, and a substrate whose surfaces are previously surface-treated to form at least one surface-treated layer may be used herein.

According to the illustrative embodiment, the coating solution for forming a resin layer, that is, a resin composition, may be prepared by dissolving the above-described components used to form a primer layer in a solvent having a relatively lower boiling point, more particularly, a solvent having a boiling point of 200° C. or less or dispersing the above-described components in water. That is, according to the present application, the fluorine-based polymer may be effectively dissolved in the solvent having a relatively low boiling point or effectively dispersed in water when the fluorine-based polymer is mixed with the oxazoline group-containing polymer. Therefore, the preparation procedure according to the present application does not require a high-temperature drying process, so that the manufacturing costs can be reduced and thermal deformation or thermal shock of the substrate, which may be caused during a high-temperature drying process, can be also prevented, thereby improving the quality of the product.

Examples of the above-described solvent that may be used herein may include at least one selected from the group consisting of water such as distilled water, acetone, methylethylketone (MEK), dimethylformamide (DMF) and dimethylacetamide (DMAC), but the present application is not particularly limited thereto.

The solvent such as MEK, DMF or DMAC may be evaporated at a temperature of 200° C. or less. In this case, the solvent may serve to readily dissolve materials for coating a resin layer including the above-described fluorine-based polymer and oxazoline group-containing polymer, and may also be dried at a relatively low temperature after being applied to the substrate together with the materials for coating a resin layer. In particular, the solvent in the resin composition may also serve to swell the surface or the surface-treated layer (for example, a primer layer) of the substrate during the coating procedure, so that interdiffusion between the fluorine-based polymer and oxazoline group-containing polymer of the resin layer and the substrate can take place in the contact interface between the substrate and the resin layer coated onto the substrate. The oxazoline group-containing polymer may form a bond with various functional groups, for example, a carboxyl group, an aromatic thiol group or a phenolic hydroxyl group, which are present on the surface of the substrate, via the double bond in the oxazoline group. Thus, since the multi-layered film has the fluorine-based polymer and oxazoline group-containing polymer distributed in the substrate adjacent to the resin layer, the adhesive strength between the substrate and the resin layer may be further improved due to the improved physical and chemical binding affinity between the resin layer and the substrate.

This arises only when a substrate is coated with the resin composition to form a multi-layered film. In this case, elemental fluorine is not diffused into the substrate when a fluorine-based film and a substrate film are laminated or attached using an adhesive. That is, according to the illustrative embodiment, the fluorine-based polymer and the oxazoline group-containing polymer distributed inside the substrate adjacent to the resin layer may be interdiffused into the surface of the substrate with which components of the resin composition come in contact when the resin composition is applied onto the substrate. As a result, the fluorine atom and oxazoline group-containing polymer may be distributed inside the substrate adjacent to the resin layer.

According to the illustrative embodiment, the resin composition used to form a resin layer may further include various additives such as a pigment, a filler, a UV stabilizer or a thermal stabilizer in addition to the fluorine-based polymer and the oxazoline group-containing polymer. Each additive may be dissolved in the solvent together with a fluorine-based polymer, or may be prepared in the form of a mill base, regardless of the components, and then mixed with the solvent including the fluorine-based polymer and the oxazoline group-containing polymer. A chemical interaction such as van der Waals linkage, hydrogen linkage, ionic linkage, or covalent linkage may take place by means of the functional group included in the additive such as a filler or pigment dispersing agent, which may be included in the above-described resin layer. As a result, the adhesive strength between the resin layer and the substrate may be further improved.

According to the illustrative embodiment, the method of preparing a resin composition, or a ratio of each component included in the resin composition is not particularly limited, but various methods known in the art may be properly selected and used herein.

According to the illustrative embodiment, after the process of coating the substrate with the resin composition, a process of drying the coated resin composition may be further performed. The drying conditions are not particularly limited, but the drying process may be, for example, performed at the temperature of 200° C. or less or 100° C. to 180° C. for 30 seconds to 30 minutes or 1 minute to 10 minutes. According to the present application, the drying process may be performed under the above-described drying conditions, so that an increase in the manufacturing costs caused by drying at a high temperature of 200° C. or more can be prevented and the quality of the product can be prevented from being deteriorated by thermal deformation or thermal shock.

Also, still another illustrative embodiment of the present application is directed to provide a backsheet for photovoltaic modules including the above-described multi-layered film according to the illustrative embodiment.

As described above, the backsheet for photovoltaic modules may include a resin layer including a fluorine-based polymer and an oxazoline group-containing polymer. Here, the oxazoline group included in the oxazoline group-containing polymer may form a chemical covalent bond with various functional groups present on the surface of the substrate to give an excellent adhesive strength between the substrate and the resin layer.

More particularly, during the preparation of the backsheet for photovoltaic modules, the fluorine-based polymer and the oxazoline group-containing polymer included in the resin layer may be interdiffused to the substrate or a surface-treated layer of the substrate from the interface between the resin layer and the substrate or the interface between the resin layer and the surface-treated layer of the substrate. Thus, a chemical covalent bond may be formed between the substrate and the resin layer, and the adhesive strength may be improved due to chain entanglement and a van der Waals force.

Also, the backsheet for photovoltaic modules according to illustrative embodiments of the present application has properties such as insulation and moisture barrier properties and also shows durability and weather resistance to stably protect the photovoltaic cells even when exposed to external environments for a long time.

Also, still another illustrative embodiment of the present application is directed to provide a photovoltaic module including the above-described backsheet for photovoltaic modules according to the present application.

A structure of the photovoltaic module according to the present application is not particularly limited as long as the photovoltaic module includes the multi-layered film as the backsheet for photovoltaic modules. Various structures of the photovoltaic module widely known in the art may be selected and used without limitation.

According to the illustrative embodiment, for example, the photovoltaic module may be configured to include a backsheet, a photovoltaic cell or photovoltaic cell array formed on the backsheet, a light-receiving sheet formed on the photovoltaic cell or photovoltaic cell array, and an encapsulant layer for encapsulating the photovoltaic cell or photovoltaic cell array between the backsheet and the light-receiving sheet.

The above-described multi-layered film according to the present application may be used as the backsheet. Here, the thickness of the backsheet is not particularly limited, but may be, for example, in the range of 30 μm to 2,000 μm, 50 μm to 1,000 μm, or 100 μm to 600 μm. The thickness of the backsheet may be controlled to 30 μm to 2,000 μm, so that the photovoltaic module can be prepared in a thinner type, and the excellent physical properties, such as weather resistance, of the photovoltaic module can also be maintained.

Specific kinds of the photovoltaic cell formed on the backsheet are not particularly limited as long as they can serve to cause a photoelectromotive force. Thus, a photovoltaic element that may be generally used in the art may be used for the photovoltaic cell. According to the present application, for example, a crystalline silicon photovoltaic cell made of monocrystalline silicon or polycrystalline silicon, an amorphous silicon photovoltaic cell such as a single binding type or tandem structure type, a Group III-V compound semiconductor photovoltaic cell made of gallium-arsenic (GaAs) or indium-phosphorus (InP), and a Group II-VI compound semiconductor photovoltaic cell made of cadmium-tellurium (CdTe) or copper-indium-selenide ($CuInSe_2$) may be used as the photovoltaic cell. Also, a thin-film polycrystalline silicon photovoltaic cell, a thin-film microcrystalline silicon photovoltaic cell, and a hybrid photovoltaic cell made of thin-film crystalline silicon and amorphous silicon may be used as the photovoltaic cell.

The photovoltaic cell may form a photovoltaic cell array (a photovoltaic cell assembly) by means of a wire used to connect the photovoltaic cells. When sunlight shines on the photovoltaic module according to the present application, electrons (−) and holes (+) are generated in the photovoltaic cell so that an electric current can flow through the wire that connects the photovoltaic cells.

The light-receiving sheet formed on the photovoltaic cell or photovoltaic cell array may serve to protect the inside of the photovoltaic module from wind, rain, external shocks or fire and secure long-term reliability when the photovoltaic module is exposed to outdoor environments. Specific kinds of the light-receiving sheet according to the present application are not particularly limited as long as the light-receiving sheet has excellent light transmission, electric insulation, and mechanical, physical or chemical strength. For example, a glass plate, a fluorine-based resin sheet, a cyclic polyolefin-based resin sheet, a polycarbonate-based resin sheet, a poly(meth) acrylic-based resin sheet, a polyamide-based resin sheet or a polyester-based resin sheet may be used herein. According to one illustrative embodiment of the present application, a glass plate having excellent heat resistance may be used, but the present application is not particularly limited thereto.

The thickness of the light-receiving substrate that may be used herein is not particularly limited, but may be, for example, in the range of 0.5 mm to 10 mm, 1 mm to 8 mm, or 2 mm to 5 mm. The thickness of the light-receiving substrate is controlled to 0.5 mm to 10 mm, so that the photovoltaic modules can be made thinner and can have excellent physical properties such as long-term reliability.

According to the present application, an encapsulant generally known in the art may also be used without limitation for an encapsulant layer toencapsulate the photovoltaic cell or photovoltaic cell array inside of the photovoltaic module, more particularly between the backsheet and the light-receiving sheet.

Figure 2:
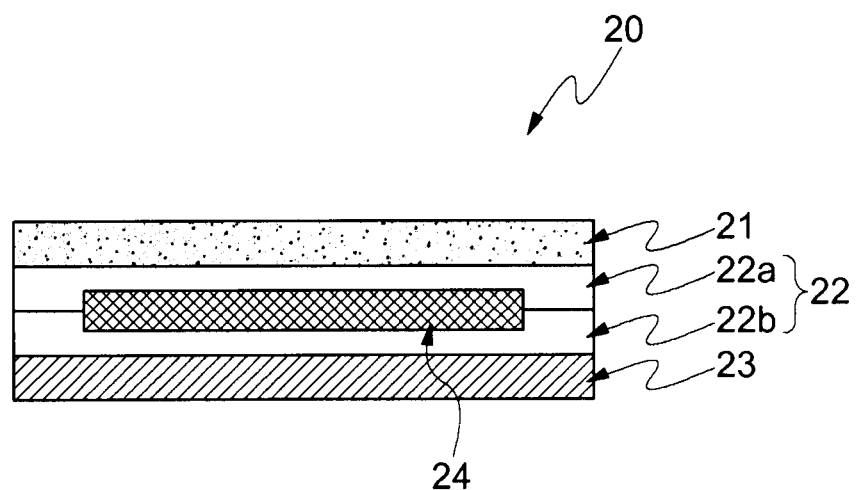
FIG. 2 is a cross-sectional view showing a photovoltaic module according to one illustrative embodiment.
Figure 3:
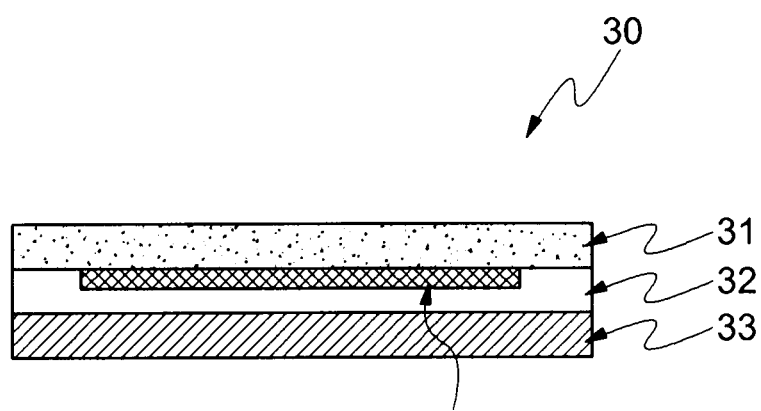
FIG. 3 is a cross-sectional view showing a photovoltaic module according to another illustrative embodiment.

FIGS. 2 and 3 are cross-sectional views showing a photovoltaic module according to various illustrative embodiments of the present application.

FIG. 2 shows one example of a wafer-based photovoltaic module 20 including a backsheet for photovoltaic modules according to the present application. As shown in FIG. 2, the photovoltaic module according to one illustrative embodiment of the present application may generally include a light-receiving sheet 21 made of a ferroelectric material (for example, glass), a backsheet 23 for photovoltaic modules according to the present application, a photovoltaic element 24 such as a silicon-based wafer, and an encapsulant layer 22 for encapsulating the photovoltaic element 24. In this case, the encapsulant layer 22 may include the first layer 22a attached to the light-receiving sheet 21 while encapsulating the photovoltaic element 24, and a second layer 22b attached to the backsheet 23 while encapsulating the photovoltaic element 24. According to the present application, the first and second layers constituting the encapsulant layer 22 may be formed of materials widely known in the art, as previously described above.

FIG. 2 is a cross-sectional view showing a thin-film photovoltaic module 30 according to another illustrative embodiment of the present application. In the case of the thin-film photovoltaic module 30, a photovoltaic element 34 may be generally formed on a light-receiving sheet 31 which may be formed of a ferroelectric material, as shown in FIG. 3. Such a thin-film photovoltaic element 34 may be generally deposited using a method such as chemical vapor deposition (CVD). Like the photovoltaic module 20 as shown in FIG. 2, the photovoltaic module 30 as shown in FIG. 3 includes an encapsulant layer 32 and a backsheet 33, and the encapsulant layer 32 may be formed in a single layer. Detailed description of the encapsulant layer 32 and the backsheet 33 have been described above.

According to the present application, a method of preparing such a photovoltaic module is not particularly limited, but the photovoltaic module may be prepared using various methods known in the art without limitation.

The photovoltaic module as shown in FIGS. 1 and 2 is merely one of the various illustrative embodiments of the photovoltaic module according to the present application. As long as the photovoltaic module includes a backsheet for a photovoltaic module according to the present application, the structure of the photovoltaic module and the kind and size of materials constituting the photovoltaic module are not particularly limited. Thus, photovoltaic modules widely known in the art may be selected and used without limitation.

Hereinafter, the illustrative embodiments of the present application will be described in further detail with reference to Examples. However, the following Examples are described only for illustrative purpose, without departing from the scope of the present application.

Physical properties of each of the films prepared in Examples and Comparative Examples were measured using the following methods.

1. 180° Peel Strength

Peel strength was measured based on the ASTM D1897 standard by cutting a test sample into pieces with a width of 10 mm and peeling the test sample at a peel rate of 4.2 mm/sec and a peel angle of 180°.

2. Cross-Hatch Adhesive Strength

The cross cut test was performed based on a crosscut test standard ASTM D3002/D3359. More specifically, 11 lines were longitudinally and vertically drawn at intervals of 1 mm on a test sample with a knife, respectively, to prepare 100 square lattices each having a width and length of 1 mm. Thereafter, when a CT-24 adhesive tape, commercially available from Nichiban Ltd., was attached to the cut surface of the test sample and detached from the cut surface, the state of the surface that was peeled off together with the tape was measured based on the following criteria.

<Evaluation Criteria of Cross-Hatch Adhesive Strength>

5B: There is no peeled surface.

4B: The peeled surface accounts for less than 5% of the entire surface.

3B: The peeled surface accounts for 5 to 15% of the entire surface.

2B: The peeled surface accounts for 15 to 35% of the entire surface.

1B: The peeled surface accounts for 35 and 65% of the entire surface.

0B: The surface is almost entirely peeled off.

3. Damp Heat Test

The multi-layered film (in which both surfaces of a substrate were coated to form a primer layer and a resin layer including a fluorine-based polymer and an oxazoline group-containing polymer) prepared in Examples and Comparative Examples were kept for 1,000 hours, 2,000 hours and 3,000 hours in an oven which was maintained under the conditions of 85° C. and 85% R.H., and the changes in the adhesive strength were then measured. The unit "R.H." throughout the specification refers to relative humidity.

4. Pressure Cooker Test (PCT)

The multi-layered film (in which both surfaces of a substrate were coated to form a primer layer and a resin layer including a fluorine-based polymer and an oxazoline group-containing polymer) prepared in Examples and Comparative Examples were kept for 25 hours, 50 hours or 75 hours in an oven which was maintained under the conditions of 2 atmospheric pressure, 121° C. and 100% R.H., and the changes in the adhesive strength were then measured.

Preparative Example 1

Preparation of Substrate Layer

The surface of a PET film (thickness: 250 μm, commercially available from Kolon) whose surfaces were not treated was performed to corona treatment.

Preparation of Fluorine-Based Polymer

In order to prepare the mixture of a fluorine-based polymer and an oxazoline group-containing polymer, a variety of fluorine-based polymers were prepared as listed in the following Table 1. Monomer components, weight average molecular weights, melting points and softening points of the fluorine-based polymers prepared in Examples and Comparative Examples are listed in the following Table 1.

TABLE 1

| | Fluorine-based polymers | Monomer ratio (weight ratio) | Weight average molecular weight ($M_w$) | Melting point (° C.) | Softening point (° C.) |
|---|---|---|---|---|---|
| A | VDF-CTFE copolymer | 85:15 (VDF:CTFE) | 270,000 | 166 | 80 |
| B | VDF-HFP copolymer | 85:15 (VDF:HFP) | 300,000 | 132 | 120 |
| C | PVDF | 100 (VDF) | 350,000 | 149 | 130 |

TABLE 1-continued

| Fluorine-based polymers | | Monomer ratio (weight ratio) | Weight average molecular weight ($M_w$) | Melting point (° C.) | Softening point (° C.) |
|---|---|---|---|---|---|
| D | PVDF | 100 (VDF) | 550,000 | 160 | 150 |
| E | VDF-HFP copolymer | 90:10 (VDF:HFP) | 330,000 | 158 | 130 |

VDF: Vinylidene fluoride
CTFE: Chlorotrifluoroethylene
HFP: Hexafluoropropylene

Example 1

Preparation of Resin Composition for Forming Resin Layer

The first coating solution was prepared by previously dissolving 70 g of fluorine-based polymer A (a copolymer including VDF and CTFE in a polymerized form at a weight ratio of 85:15 (VDF:CTFE)) prepared in Preparative Example 1, 30 g of fluorine-based polymer D (a polymer of VDF (PVDF)) prepared in Preparative Example 1 and 1 g of an oxazoline group-containing acryl-based copolymer (WS-500 (solid content: 40%), commercially available from Nippon Catalyst Co. Ltd.) having a weight average molecular weight of 70,000 in 400 g of DMF.

Regardless of the above-described procedure, 0.9 g of a pigment dispersing agent, BYK 111 (commercially available from BYK), and 90 g of a pigment, titanium dioxide (TiPure TS6200, commercially available from DuPont), were also dissolved in 90 g of DMF, and 50 g of zirconia beads having a diameter of 0.3 mm was further added. Then, the resulting mixture was stirred at a rate of 1,000 rpm for 1 hour, and the zirconia beads were then completely removed to prepare 180.9 g of a mill base dispersion.

120.0 g of the prepared mill base dispersion (including 60 g of titanium dioxide) was added to the previously prepared first coating solution, and stirred again to prepare a resin composition for forming the resin layer.

Coating and Drying

The resin composition for forming the resin layer was applied on the previously prepared substrate using a comma reverse method. More particularly, the coating solution was coated on a substrate at such intervals that the thickness after drying could be adjusted to approximately 20 μm, and the coated substrate was sequentially passed through three ovens, lengths of each of which were 2 m and temperatures of which were set to 80° C., 180° C. and 180° C., at a rate of 1 m/min to form the resin layer. Thereafter, the other surface of the substrate was coated with the resin composition in the same manner to prepare the multi-layered film in which both surfaces of the PET film (a substrate) were coated with the mixture of the fluorine-based polymer and the oxazoline group-containing polymer.

Examples 2 to 5

Multi-layered films were prepared in the same manner as in Example 1, except that the contents of the oxazoline group-containing acryl-based copolymer (WS-500 (solid content: 40%), commercially available from Nippon Catalyst Co. Ltd.) having a weight average molecular weight of 70,000 were changed as listed in the following Table 2.

Example 6

A multi-layered film was prepared in the same manner as in Example 1, except that 5 g of the oxazoline group-containing acryl-based copolymer (WS-700 (solid content: 25%), commercially available from Nippon Catalyst Co. Ltd.) having a weight average molecular weight of 40,000 was used instead of 1 g of the oxazoline group-containing acryl-based copolymer (WS-500 (solid content: 40%), commercially available from Nippon Catalyst Co. Ltd.) having a weight average molecular weight of 70,000.

Example 7

A multi-layered film was prepared in the same manner as in Example 3, except that the fluorine-based polymer B (a copolymer including VDF and HFP at a weight ratio of 85:15 (VDF:HFP) in a polymerized form) prepared in Preparative Example 1 was used instead of the fluorine-based polymer A.

Example 8

A multi-layered film was prepared in the same manner as in Example 3, except that 100 g of fluorine-based polymer C (a polymer of VDF (PVDF)) prepared in Preparative Example 1 was used instead of 70 g of the fluorine-based polymer A.

Example 9

A multi-layered film was prepared in the same manner as in Example 1, except that an aqueous dispersion composition was prepared by dispersing 250 g of an emulsion of the fluorine-based polymer A (a copolymer emulsion including VDF and CTFE at a weight ratio 85:15 (VDF:CTFE) in a polymerized form, and this dispersion being dispersed in water at a solid content of 20%) prepared in Preparative Example 1; 250 g of an emulsion of the fluorine-based polymer D (a PVDF emulsion, and this dispersion being dispersed in water at a solid content of 20%) prepared in Preparative Example 1; 10 g of an oxazoline group-containing acryl-based copolymer (WS-500 (solid content: 40%), commercially available from Nippon Catalyst Co. Ltd.) having a weight average molecular weight of 70,000; and 30 g of a pigment, titanium dioxide (TiPure TS6200, commercially available from DuPont), using a stirrer during the preparation of the resin composition prepared in Example 1.

Comparative Example 1

A commercially available stacked structure of Tedlar film/adhesive/PET film/adhesive/Tedlar film was used as the multi-layered film. The stacked structure was a product obtained by laminating the Tedlar film (PVF film (thickness: 38 μm), commercially available from DuPont) prepared in an extrusion process to both surfaces of the PET film using an adhesive.

Comparative Example 2

A commercially available stacked structure of Tedlar film/adhesive/PET film/adhesive/Tedlar film was used as the multi-layered film. The stacked structure was a product obtained by laminating the Tedlar film (PVF film (thickness: 25 μm), commercially available from DuPont) prepared in a casting process to both surfaces of the PET film using an adhesive.

Comparative Example 3

A multi-layered film was prepared in the same manner as in Example 1, except that 2 g of an epoxy group-containing acryl-based copolymer (an acryl-based copolymer including methylmethacrylate, glycidylmethacrylate, butylmethacrylate and styrene at a weight ratio of 49.5:35.5:10:5) having a weight average molecular weight of 40,000 was used instead of 1 g of the oxazoline group-containing acryl-based copolymer (WS-500 (solid content: 40%), commercially available from Nippon Catalyst Co. Ltd.) having a weight average molecular weight of 70,000.

Comparative Example 4

A multi-layered film was prepared in the same manner as in Example 1, except that the oxazoline group-containing acryl-based copolymer (WS-500 (solid content: 40%), commercially available from Nippon Catalyst Co. Ltd.) having a weight average molecular weight of 70,000 was not used herein.

Comparative Example 5

A multi-layered film was prepared in the same manner as in Example 8, except that 100 g of the fluorine-based polymer D (PVDF) prepared in Preparative Example 1 was used instead of the fluorine-based polymer C

Comparative Example 6

A multi-layered film was prepared in the same manner as in Example 8, except that 100 g of the fluorine-based polymer E (a copolymer including VDF and HFP at a weight ratio of 90:10 (VDF:HFP) in a polymerized form) prepared in Preparative Example 1 was used instead of the fluorine-based polymer C.

TABLE 2

| | | Coating solution (Resin composition) | | | |
|---|---|---|---|---|---|
| | | Fluorine-based polymers | | Pigments Content | Reactive polymers Content |
| | | Compositions | Content (g) | (g) | (g) |
| Examples | 1 | Fluorine-based polymer A | 70 | TiO$_2$ | WS-500 |
| | | Fluorine-based polymer D | 30 | 60 | 1 |
| | 2 | Fluorine-based polymer A | 70 | TiO$_2$ | WS-500 |
| | | Fluorine-based polymer D | 30 | 60 | 3 |
| | 3 | Fluorine-based polymer A | 70 | TiO$_2$ | WS-500 |
| | | Fluorine-based polymer D | 30 | 60 | 5 |
| | 4 | Fluorine-based polymer A | 70 | TiO$_2$ | WS-500 |
| | | Fluorine-based polymer D | 30 | 60 | 7 |
| | 5 | Fluorine-based polymer A | 70 | TiO$_2$ | WS-500 |
| | | Fluorine-based polymer D | 30 | 60 | 10 |
| | 6 | Fluorine-based polymer A | 70 | TiO$_2$ | WS-700 |
| | | Fluorine-based polymer D | 30 | 60 | 5 |
| | 7 | Fluorine-based polymer B | 70 | TiO$_2$ | WS-500 |
| | | Fluorine-based polymer D | 30 | 60 | 5 |
| | 8 | Fluorine-based polymer C | 100 | TiO$_2$ | WS-500 |
| | | | | 60 | 5 |
| | 9 | Emulsion of fluorine-based polymer A | 250 (50)[1] | TiO$_2$ | WS-500 |
| | | | | 30 | 10 |
| | | Emulsion of fluorine-based polymer D | 250 (50)[1] | | |
| Comparative Examples | 1 | Tedlar (extrusion)/adhesive/PET/adhesive/Tedlar (extrusion) | — | — | |
| | 2 | Tedlar (casting)/adhesive/PET/adhesive/Tedlar (casting) | — | — | |
| | 3 | Fluorine-based polymer A | 70 | TiO$_2$ | Epoxy group-containing acryl copolymer (M$_w$: 40,000) 2.0 |
| | | Fluorine-based polymer D | 30 | 60 | |
| | 4 | Fluorine-based polymer A | 70 | TiO$_2$ | — |
| | | Fluorine-based polymer D | 30 | 60 | |
| | 5 | Fluorine-based polymer D | 100 | TiO$_2$ | WS-500 |
| | | | | 60 | 5 |
| | 6 | Fluorine-based polymer E | 100 | TiO$_2$ | WS-500 |
| | | | | 60 | 5 |

WS-500: Oxazoline group-containing acryl-based polymer (commercially available from Nippon Catalyst Co. Ltd.) having a weight average molecular weight of 70,000
WS-700: Oxazoline group-containing acryl-based polymer (commercially available from Nippon Catalyst Co. Ltd.) having a weight average molecular weight of 40,000
Note:
[1] represents that a content of an emulsion of fluorine-based polymer prepared in Example 9 is 250 g, and a content of the fluorine-based polymer in the emulsion is 50 g. The emulsion of fluorine-based polymer refers to a state where the fluorine-based polymer is dispersed in the form of an emulsion, and water is not removed during the preparation of a polymer.

Experimental Example 1

The pressure cooker test (PCT) was performed on each of the multi-layered films prepared in Examples 1 to 9 and Comparative Examples 1 to 6, followed by the 180° peel strength and cross-hatch tests. More particularly, each of the multi-layered films was kept under the conditions of 2 atmospheric pressure, 121° C. and 100% R.H. for 25 hours, 50 hours, and 75 hours, and the 180° peel strength and cross-hatch tests were then performed to determine the change in the adhesive strength. The evaluation results are listed in the following Table 3.

TABLE 3

|  |  | 180° Peel strength (N/cm) | | | | Cross-hatch test results | | | |
|---|---|---|---|---|---|---|---|---|---|
|  |  | Initial | 25 hrs | 50 hrs | 75 hrs | Initial | 25 hrs | 50 hrs | 75 hrs |
| Examples | 1 | 4.3 | 1.8 | 2.1 | 1.8 | 5B | 5B | 5B | 5B |
|  | 2 | Coat-T | Coat-T | Coat-T | Coat-T | 5B | 5B | 5B | 5B |
|  | 3 | Coat-T | Coat-T | Coat-T | 3.2 | 5B | 5B | 5B | 5B |
|  | 4 | Coat-T | Coat-T | Coat-T | Coat-T | 5B | 5B | 5B | 5B |
|  | 5 | Coat-T | Coat-T | Coat-T | 2.5 | 5B | 5B | 4B | 5B |
|  | 6 | 4.1 | 1.5 | 1.8 | 1.1 | 5B | 5B | 5B | 5B |
|  | 7 | Coat-T | Coat-T | Coat-T | Coat-T | 5B | 5B | 5B | 5B |
|  | 8 | Coat-T | 3.3 | 3.1 | 2.3 | 5B | 5B | 5B | 5B |
|  | 9 | Coat-T | Coat-T | Coat-T | Coat-T | 5B | 5B | 5B | 5B |
| Comparative | 1 | PVF-T | PVF-T | PVF-T | 0.4 | 5B | 5B | 5B | 1B |
| Examples | 2 | 6.7 | 4.4 | 1.3 | 0.3 | 5B | 5B | 1B | 1B |
|  | 3 | 0 | 0 | 0 | 0 | 0B | 0B | 0B | 0B |
|  | 4 | 0 | 0 | 0 | 0 | 0B | 0B | 0B | 0B |
|  | 5 | Coat-T | 0 | 0 | 0 | 5B | 0B | 0B | 0B |
|  | 6 | Coat-T | 0 | 0 | 0 | 5B | 0B | 0B | 0B |

Coat-T: Accurate peel strength could not be measured because the resin layer was torn while being peeled.
PVF-T: Accurate peel strength could not be measured because the PVF layer was torn while being peeled.

As listed in Table 3, for the multi-layered films according to the illustrative embodiments of the present application, the resin layer including the mixture of the fluorine-based polymer and the oxazoline group-containing acryl-based copolymer exhibited high initial adhesive strength to the substrate (PET), and also had an excellent adhesive strength even after the PCT was performed for 75 hours. Even after the PCT was performed for 75 hours, no changes in the appearance such as interface peeling and pinhole generation were observed in the resin layer. Meanwhile, it was confirmed that the commercially available multi-layered films, Tedlar film/adhesive/PET/adhesive/Tedlar films (Comparative Examples 1 and 2), showed a greatly decreased adhesive strength to the substrate while performing the PCT on the multi-layered films. In the case of Comparative Example 3 in which the epoxy group-containing polymer was used instead of the oxazoline group-containing polymer as a reactive polymer mixed together with the fluorine-based polymer or Comparative Example 4 in which the oxazoline group-containing polymer was not added at all, the multi-layered films also showed poor adhesive reliability, compared to those of Examples according to the present application. In the case of Comparative Examples 5 and 6 in which the fluorine-based polymer having a melting point of 155° C. or less or a softening point of 100° C. or less was not added, it was confirmed that the multi-layered films also showed good initial adhesive strength but had a greatly decreased adhesive strength after performing the PCT.

Experimental Example 2

The damp heat test was performed on each of the multi-layered films prepared in Examples 1 and 9 and Comparative Examples 1 to 6, followed by the 180° peel strength and cross-hatch tests. More particularly, each of the multi-layered films was kept for 1,000 hours, 2,000 hours and 3,000 hours in an oven which was maintained under the conditions of 85° C. and 85% R.H., and the 180° peel strength and cross-hatch tests were then performed to determine the change in the adhesive strength. The evaluation results are listed in the following Table 4.

TABLE 4

|  |  | 180° Peel strength (N/cm) | | | | Cross-hatch test results | | | |
|---|---|---|---|---|---|---|---|---|---|
|  |  | Initial | 1,000 hrs | 2,000 hrs | 3,000 hrs | Initial | 1,000 hrs | 2,000 hrs | 3,000 hrs |
| Examples | 1 | 4.3 | Coat-T | 3.1 | 1.2 | 5B | 5B | 1B | 1B |
|  | 2 | Coat-T | Coat-T | Coat-T | Coat-T | 5B | 5B | 5B | 4B |
|  | 3 | Coat-T | Coat-T | 3.8 | 3.7 | 5B | 5B | 5B | 4B |
|  | 4 | Coat-T | Coat-T | 3.7 | 2.6 | 5B | 5B | 5B | 4B |
|  | 5 | Coat-T | Coat-T | 2.1 | 1.9 | 5B | 5B | 4B | 4B |
|  | 6 | 4.1 | 2.7 | 2.7 | 2.1 | 5B | 5B | 4B | 4B |
|  | 7 | Coat-T | Coat-T | Coat-T | 2.5 | 5B | 5B | 3B | 2B |
|  | 8 | Coat-T | Coat-T | Coat-T | 1.5 | 5B | 5B | 5B | 2B |
|  | 9 | Coat-T | Coat-T | Coat-T | Coat-T | 5B | 5B | 5B | 5B |

TABLE 4-continued

|  |  | 180° Peel strength (N/cm) | | | | Cross-hatch test results | | | |
|---|---|---|---|---|---|---|---|---|---|
|  |  | Initial | 1,000 hrs | 2,000 hrs | 3,000 hrs | Initial | 1,000 hrs | 2,000 hrs | 3,000 hrs |
| Comparative | 1 | PVF-T | PVF-T | PVF-T | 0.1 | 5B | 5B | 5B | 0B |
| Examples | 2 | 7 | 2 | 0.7 | 0.2 | 5B | 5B | 4B | 0B |
|  | 3 | 0 | 0 | 0 | 0 | 0B | 0B | 0B | 0B |
|  | 4 | 0 | 0 | 0 | 0 | 0B | 0B | 0B | 0B |
|  | 5 | Coat-T | 0 | 0 | 0 | 5B | 0B | 0B | 0B |
|  | 6 | Coat-T | 0 | 0 | 0 | 5B | 0B | 0B | 0B |

Coat-T: Accurate peel strength could not be measured because the resin layer was torn while being peeled.
PVF-T: Accurate peel strength could not be measured because the PVF layer was torn while being peeled.

As listed in Table 4, for the multi-layered films according to the illustrative embodiments of the present application, the resin layer including the mixture of the fluorine-based polymer and the oxazoline group-containing acryl-based copolymer exhibited high initial adhesive strength to the substrate (PET), and also had an excellent adhesive strength even after the damp heat test was performed for 3,000 hours. Even after the damp heat test was performed for 3,000 hours, no changes in the appearance such as interface peeling and pinhole generation were observed in the resin layer. Meanwhile, it was confirmed that the commercially available multi-layered films, Tedlar film/adhesive/PET/adhesive/Tedlar films (Comparative Examples 1 and 2), showed a greatly decreased adhesive strength to the substrate while performing the damp heat test on the multi-layered films. In the case of Comparative Example 3 in which the epoxy group-containing polymer was used instead of the oxazoline group-containing polymer as the reactive polymer mixed together with the fluorine-based polymer or Comparative Example 4 in which the oxazoline group-containing polymer was not added at all, the multi-layered films also showed poor adhesive reliability, compared to those of Examples according to the present application. In the case of Comparative Examples 5 and 6 in which the fluorine-based polymer having a melting point of 155° C. or less or a softening point of 100° C. or less was not added, it was confirmed that the multi-layered films also showed good initial adhesive strength but had a greatly decreased adhesive strength after performing the damp heat test.

Examples 10 to 15

A multi-layered film was prepared in the same manner as in Example 1, except that the contents of the oxazoline group-containing acryl-based copolymer (WS-500 (solid content: 40%), commercially available from Nippon Catalyst Co. Ltd.) having a weight average molecular weight of 70,000 were changed as listed in the following Table 5, and other pigments and contents as listed in the following Table 5 were used instead of the titanium dioxide (TiPure TS6200, commercially available from DuPont) as the pigment during the preparation of the mill base dispersion.

Comparative Example 7

A multi-layered film was prepared in the same manner as in Example 1, except that 5 g of an epoxy group-containing acryl-based copolymer (an acryl-based copolymer including methylmethacrylate, glycidylmethacrylate, butylmethacrylate and styrene at a weight ratio of 49.5:35.5:10:5) having a weight average molecular weight of 40,000 was used instead of 1 g of the oxazoline group-containing acryl-based copolymer (WS-500 (solid content: 40%), commercially available from Nippon Catalyst Co. Ltd.) having a weight average molecular weight of 70,000, and a pigment, titanium dioxide (TiPure TS6200, commercially available from DuPont), was not used herein.

Comparative Example 8

A multi-layered film was prepared in the same manner as in Example 1, except that 5 g of an epoxy group-containing acryl-based copolymer (an acryl-based copolymer including methylmethacrylate, glycidylmethacrylate, butylmethacrylate and styrene at a weight ratio of 49.5:35.5:10:5) having a weight average molecular weight of 40,000 was used instead of 1 g of the oxazoline group-containing acryl-based copolymer (WS-500 (solid content: 40%), commercially available from Nippon Catalyst Co. Ltd.) having a weight average molecular weight of 70,000, and other pigments and contents as listed in the following Table 5 were used instead of the titanium dioxide (TiPure TS6200, commercially available from DuPont) as the pigment during the preparation of the mill base dispersion.

TABLE 5

| | | Coating solution (Resin composition) | | | |
|---|---|---|---|---|---|
| | | Fluorine-based polymers | | | Reactive |
| | | Compositions | Content (g) | Pigments (Content) | polymers Content (g) |
| Examples | 10 | Same as in Example 1 | Same as in Example 1 | 30C965 (40 g) | WS-500 5 |
| | 11 | Same as in Example 1 | Same as in Example 1 | Black 1G (40 g) | WS-500 5 |
| | 12 | Same as in Example 1 | Same as in Example 1 | Black 430 (40 g) | WS-500 5 |
| | 13 | Same as in Example 1 | Same as in Example 1 | Iron oxide (40 g) | WS-500 5 |
| | 14 | Same as in Example 1 | Same as in Example 1 | TiO$_2$ (5 g) + MA100 (2.5 g) | WS-500 5 |
| | 15 | Same as in Example 1 | Same as in Example 1 | — | WS-500 5 |
| Comparative Examples | 7 | Same as in Example 1 | Same as in Example 1 | — | Epoxy group-containing acryl copolymer (Mw: 40,000) 5 |
| | 8 | Same as in Example 1 | Same as in Example 1 | 30C965 (40 g) | Epoxy group-containing acryl copolymer (Mw: 40,000) 5 |

WS-500: Oxazoline group-containing acryl-based polymer (commercially available from Nippon Catalyst Co. Ltd.) having a weight average molecular weight of 70,000
30C965: Ceramic pigment in the form of complex metaloxide (black pigment, commercially available from Shepherd)
Black 1G: Ceramic pigment in the form of complex metaloxide (black pigment, commercially available from Shepherd)
Black 430: Ceramic pigment in the form of complex metaloxide (black pigment, commercially available from Shepherd)
Iron oxide: Oxide black (black pigment)
MA100: Carbon black (black pigment, commercially available from Mitsubishi Chemical Corp.)

Experimental Example 3

The PCT was performed on the multi-layered films prepared in Examples 10 to 15 and Comparative Examples 7 and 8, followed by the 180° peel strength and cross-hatch tests. More particularly, each of the multi-layered films was kept under the conditions of 2 atmospheric pressure, 121° C. and 100% R.H. for 25 hours, 50 hours, and 75 hours, and the 180° peel strength and cross-hatch tests were then performed to determine the change in the adhesive strength. The evaluation results are listed in the following Table 6.

TABLE 6

| | | 180° Peel strength (N/cm) | | | | Cross-hatch test results | | | |
|---|---|---|---|---|---|---|---|---|---|
| | | Initial | 25 hrs | 50 hrs | 75 hrs | Initial | 25 hrs | 50 hrs | 75 hrs |
| Examples | 10 | Coat-T | Coat-T | Coat-T | Coat-T | 5B | 5B | 5B | 5B |
| | 11 | Coat-T | Coat-T | Coat-T | 2.5 | 5B | 5B | 5B | 5B |
| | 12 | Coat-T | Coat-T | Coat-T | Coat-T | 5B | 5B | 5B | 5B |
| | 13 | 3.0 | Coat-T | Coat-T | 3.3 | 5B | 5B | 5B | 5B |
| | 14 | Coat-T | 4.5 | 2.5 | 1.4 | 5B | 5B | 5B | 4B |
| | 15 | 4.6 | 3.7 | 2.5 | 2.1 | 5B | 5B | 5B | 4B |
| Comparative | 7 | 0 | 0 | 0 | 0 | 0B | 0B | 0B | 0B |
| Examples | 8 | 0 | 0 | 0 | 0 | 0B | 0B | 0B | 0B |

Coat-T: Accurate peel strength could not be measured because the resin layer was torn while being peeled.

As listed in Table 6, for the multi-layered films according to the illustrative embodiments of the present application, since the resin layer included the mixture of the fluorine-based polymer and the oxazoline group-containing acryl-based copolymer, the resin layer exhibited high initial adhesive strength to the substrate (PET) even when the pigment was not used or a black pigment was used as the pigment, that is, regardless of the kinds and presence of the pigment, and also had an excellent adhesive strength even after the PCT was performed for 75 hours. Even after the PCT was performed for 75 hours, no changes in the appearance such as interface peeling and pinhole generation were observed in the resin layer. Meanwhile, in the case of Comparative Examples 7 and 8 in which the epoxy group-containing polymer was used instead of the oxazoline group-containing polymer as a reactive polymer mixed together with the fluorine-based polymer, the multi-layered films also showed poor adhesive reliability, compared to those of Examples according to the present application.

Experimental Example 4

The damp heat test was performed on the multi-layered films prepared in Examples 10 to 15 and Comparative Examples 7 and 8, followed by the 180° peel strength and cross-hatch tests. More particularly, each of the multi-layered films was kept for 1,000 hours, 2,000 hours and 3,000 hours in an oven which was maintained under the conditions of 85° C. and 85% R.H., and the 180° peel strength and cross-hatch tests were then performed to determine the change in the adhesive strength. The evaluation results are listed in the following Table 7.

As listed in Table 7, for the multi-layered films according to the illustrative embodiments of the present application, since the resin layer included the mixture of the fluorine-based polymer and the oxazoline group-containing acryl-based copolymer, the resin layer exhibited high initial adhesive strength to the substrate (PET) even when the pigment was not used or a black pigment was used as the pigment, that is, regardless of the kinds and presence of the pigment, and also had an excellent adhesive strength even after the damp heat test was performed for 3,000 hours. Even after the damp heat test was performed for 3,000 hours, no changes in the appearance such as interface peeling and pinhole generation were observed in the resin layer. Meanwhile, in the case of Comparative Examples 7 and 8 in which the epoxy group-containing polymer was used instead of the oxazoline group-containing polymer as a reactive polymer mixed together with the fluorine-based polymer, the multi-layered films also showed poor adhesive reliability, compared to those of Examples according to the present application.

The illustrative embodiments of the present application may provide a multi-layered film having excellent reliability and adhesive strength under high heat/moisture conditions and also showing excellent weather resistance and durability since the multi-layered film includes the resin layer including the fluorine-based polymer and the oxazoline group-containing polymer. Also, the resin layer of the multi-layered film according to the present application may be manufactured at a low cost under a low drying temperature using a solvent having a low boiling point, so that the manufacturing costs can be reduced. The multi-layered film may be effectively used for the backsheet for photovoltaic modules so that the photovoltaic module can exhibit excellent durability even when exposed to external environments for a long time.

While the illustrative embodiments of the invention has been shown and described with reference to certain illustrative embodiments thereof, it will be understood by those

TABLE 7

| | | 180° Peel strength(N/cm) | | | | Cross-hatch test results | | | |
|---|---|---|---|---|---|---|---|---|---|
| | | Initial | 1,000 hrs | 2,000 hrs | 3,000 hrs | Initial | 1,000 hrs | 2,000 hrs | 3,000 hrs |
| Examples | 10 | Coat-T | Coat-T | Coat-T | Coat-T | 5B | 5B | 5B | 5B |
| | 11 | Coat-T | Coat-T | Coat-T | Coat-T | 5B | 5B | 5B | 5B |
| | 12 | Coat-T | Coat-T | Coat-T | Coat-T | 5B | 5B | 5B | 5B |
| | 13 | 3.0 | Coat-T | Coat-T | 3.5 | 5B | 5B | 5B | 5B |
| | 14 | Coat-T | 3.2 | 2.0 | 1.4 | 5B | 5B | 5B | 4B |
| | 15 | 4.6 | 3.9 | 2.8 | 1.7 | 5B | 5B | 5B | 4B |
| Comparative | 7 | 0 | 0 | 0 | 0 | 0B | 0B | 0B | 0B |
| Examples | 8 | 0 | 0 | 0 | 0 | 0B | 0B | 0B | 0B |

Coat-T: Accurate peel strength could not be measured because the resin layer was torn while being peeled.

What is claimed is:

1. A multi-layered film comprising:
a polymer film; and
a resin layer formed on the polymer film and including a fluorine-based polymer and an oxazoline group-containing polymer,
wherein fluorine atoms originating from the fluorine-based polymer are distributed inside the polymer film adjacent to the resin layer, and
wherein the fluorine-based polymer includes a first fluorine-based polymer having a melting point of 155° C. or less or a softening point of 100° C. or less.

2. The multi-layered film of claim 1, wherein the polymer film is at least one selected from the group consisting of an acryl film, a polyolefin film, a polyamide film, a polyurethane film, a polyethylene terephthalate (PET) film, a polyethylene naphthalate (PEN) film and a polybutylene terephthalate (PBT) film.

3. The multi-layered film of claim 1, wherein at least one surface treatment selected from the group consisting of treatments with plasma, a corona, a primer, an anchor agent and a coupling agent, and thermal treatment is performed on one surface or both surfaces of the substrate.

4. The multi-layered film of claim 1, wherein an inorganic oxide deposition layer is formed on one surface or both surfaces of the substrate.

5. The multi-layered film of claim 1, wherein the substrate has the thickness of 50 μm to 500 μm.

6. The multi-layered film of claim 1, wherein the fluorine-based polymer is a homopolymer, a copolymer or a mixture thereof including at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutyl ethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxol (PDD) and perfluoro-2-methylene-4-methyl-1,3-dioxolane (PMD) in a polymerized form.

7. The multi-layered film of claim 1, wherein the fluorine-based polymer is a copolymer or a mixture thereof including vinylidene fluoride (VDF) or vinyl fluoride (VF) and at least one comonomer selected from the group consisting of tetrafluoroethylene (TFE), hexafluoropropylene (HFP), chlorotrifluoroethylene (CTFE), trifluoroethylene, hexafluoroisobutylene, perfluorobutyl ethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxol (PDD) and perfluoro-2-methylene-4-methyl-1,3-dioxolane (PMD).

8. The multi-layered film of claim 7, wherein the comonomer is included in the fluorine-based copolymer in an amount of 0.5% by weight to 50% by weight, based on the total weight of the fluorine-based copolymer.

9. The multi-layered film of claim 1, wherein the fluorine-based polymer has a weight average molecular weight of 50,000 to 1,000,000.

10. The multi-layered film of claim 1, wherein the fluorine-based polymer includes a second fluorine-based polymer having a melting point of 155° C. or more and a softening point of 100° C. or more.

11. The multi-layered film of claim 1, wherein the first fluorine-based polymer having a melting point of 155° C. or less or a softening point of 100° C. or less is present at a ratio of 20 weight % by weight, based on the total weight of the fluorine-based polymer.

12. The multi-layered film of claim 1, wherein the oxazoline group-containing polymer is a homopolymer of an oxazoline group-containing monomer; a copolymer including an oxazoline group-containing monomer and at least one comonomer; or a mixture thereof.

13. The multi-layered film of claim 12, wherein the oxazoline group-containing monomer is a compound represented by the following Formula 1:

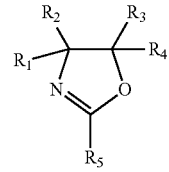

Formula 1 wherein $R_1$, $R_2$, $R_3$ and $R_4$ each independently represent a hydrogen atom, an alkyl group, a halogen, or a substituted or unsubstituted phenyl group, and $R_5$ represents an acyclic hydrocarbon group having an unsubstituted bond.

14. The multi-layered film of claim 12, wherein the oxazoline group-containing monomer is at least one selected from the group consisting of 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline.

15. The multi-layered film of claim 12, wherein the oxazoline group-containing monomer is included in the copolymer in an amount of 1% by weight or more, based on the total weight of the copolymer including the oxazoline group-containing monomer and at least one comonomer.

16. The multi-layered film of claim 15, wherein the oxazoline group-containing monomer is included in the copolymer is an amount of 5% by weight to 95% by weight, based on the total weight of the copolymer including the oxazoline group-containing monomer and at least one comonomer.

17. The multi-layered film of claim 12, wherein the comonomer included in the copolymer is at least one selected from the group consisting of an alkyl(meth)acrylate, an amide group-containing monomer, an unsaturated nitrile-based monomer, a vinyl ester-based monomer, a vinyl ether-based monomer, a halogen-containing α,β-unsaturated monomer and an α,β-unsaturated aromatic monomer.

18. The multi-layered film of claim 17, wherein the alkyl (meth)acrylate is at least one selected from the group consisting of methyl(meth)acrylate, ethyl(meth)acrylate, propyl (meth)acrylate, n-butyl(meth)acrylate, s-butyl(meth) acrylate, t-butyl(meth)acrylate, isobutyl(meth)acrylate, hexyl(meth)acrylate, 2-ethylhexyl(meth)acrylate, n-octyl (meth)acrylate, isooctyl(meth)acrylate, n-nonyl(meth)acrylate, isononyl(meth)acrylate, n-decyl(meth)acrylate, isodecyl(meth)acrylate, n-dodecyl(meth)acrylate and n-tridecyl (meth)acrylate and n-tetradecyl(meth)acrylate.

19. The multi-layered film of claim 1, wherein the oxazoline group-containing polymer has a weight average molecular weight of 5,000 to 500,000.

20. The multi-layered film of claim 1, wherein the resin layer comprises the oxazoline group-containing polymer in an amount of 0.1 parts by weight to 50 parts by weight, based on 100 parts by weight of the fluorine-based polymer.

21. The multi-layered film of claim 1, wherein the resin layer has a thickness of 3 µm to 50 µm.

22. The multi-layered film of claim 1, wherein the resin layer further comprises at least one additive selected from the group consisting of a pigment, a filler, a UV stabilizer, a thermal stabilizer and barrier particles.

23. A backsheet for photovoltaic modules comprising the multi-layered film defined in any one of claims 1 and 2 to 22.

24. A photovoltaic module comprising the backsheet for photovoltaic modules defined in claim 23.

25. A method of manufacturing a multi-layered film, comprising:
    forming a resin layer including a fluorine-based polymer and an oxazoline group-containing polymer on a polymer film,
    wherein fluorine atoms originating from the fluorine-based polymer are distributed inside the polymer film adjacent to the resin layer, and
    wherein the fluorine-based polymer includes a first fluorine-based polymer having a melting point of 155° C. or less or a softening point of 100° C. or less.

26. The method of claim 25, wherein the formation of the resin layer including the fluorine-based polymer and the oxazoline group-containing polymer is performed by coating a substrate with a resin composition including a fluorine-based polymer, an oxazoline group-containing polymer and a solvent having a boiling point of 200° C. or less, or an aqueous dispersion composition including a fluorine-based polymer, an oxazoline group-containing polymer and water.

27. The method of claim 26, wherein the solvent having a boiling point of 200° C. or less is at least one selected from the group consisting of acetone, methylethylketone, dimethylformamide and dimethylacetamide.

28. The method of claim 26, further comprising, after coating the substrate with the resin composition:
    drying the resin composition.

29. The method of claim 28, wherein the drying is performed at a temperature of 200° C. or less for 30 seconds to 30 minutes.

30. The method of claim 25, further comprising before forming the resin layer:
    performing at least one surface treatment selected from the group consisting of plasma treatment, corona treatment, primer treatment, anchoring agent treatment, coupling agent treatment, deposition treatment and thermal treatment on one surface or both surfaces of the substrate.

31. The method of claim 25, wherein the fluorine-based polymer includes a second fluorine-based polymer having a melting point of 155° C. or more and a softening point of 100° C. or more.

* * * * *